United States Patent [19]

Smith

[11] Patent Number: 5,485,395
[45] Date of Patent: Jan. 16, 1996

[54] METHOD FOR PROCESSING SAMPLED DATA SIGNALS

[75] Inventor: Craig C. Smith, Provo, Utah

[73] Assignee: Brigham Young University, Provo, Utah

[21] Appl. No.: 195,994

[22] Filed: Feb. 14, 1994

[51] Int. Cl.⁶ .................. G06F 17/00; G01J 3/28
[52] U.S. Cl. ............ 364/485; 324/76.19; 324/76.24; 324/76.33; 364/571.01
[58] Field of Search .............. 324/76.19, 76.24, 324/76.33; 328/167; 364/485, 571.01; 375/99, 103

[56] References Cited

U.S. PATENT DOCUMENTS

| | | | |
|---|---|---|---|
| 3,466,431 | 9/1969 | Fuchs et al. | 364/485 |
| 3,544,894 | 12/1970 | Hartwell et al. | 364/485 X |
| 3,932,737 | 1/1976 | Delepine | 324/76.19 X |
| 4,031,462 | 6/1977 | Bouvier et al. | 324/76.33 X |
| 4,591,928 | 5/1986 | Bloom et al. | 360/13 |
| 5,121,337 | 6/1992 | Brown | 364/571.01 X |
| 5,216,696 | 6/1993 | Poklemba | 375/99 |
| 5,420,501 | 5/1995 | Matsuoka | 324/76.24 X |

*Primary Examiner*—Edward R. Cosimano
*Attorney, Agent, or Firm*—Thorpe, North & Western

[57] ABSTRACT

An electronic system for processing sampled data signals to determine the frequency spectra of the signals comprises windowing the sampled signal to a length of an MN data point series. The series of data points is divided into M contiguous blocks numbered from 0 to M−1, each block containing N data points numbered from 0 to N−1. Each block is then added into a memory having N registers numbered from 0 to N−1, the value of the data point in each block being added into the value in the correspondingly numbered register such that each numbered register contains the sum of correspondingly numbered data points in the blocks, and such that the memory comprises a time-aliased series of N data points. The time-aliased series is then Fourier transformed, yielding a spectra with leakage consistent with a window of length MN at the spectral lines of the N-point transform. A smoothed sinc windowing function for leakage to adjacent spectral lines is also described.

24 Claims, 7 Drawing Sheets

METHOD FOR PROCESSING SAMPLED DATA SIGNALS

FIELD OF THE INVENTION

The present invention relates to the processing of sampled data signals and particularly to the determination of frequency spectra of temporal space signals.

BACKGROUND OF THE INVENTION

In numerous applications in signal processing, it is desired to determine the frequency spectra, or component frequencies, of time domain signals. This is done by sampling the signal at a predetermined sampling rate over an interval or window of time $T_0$, yielding a series of data points which represent the signal. The component frequencies of the signal are then determined from the data points through a Fourier transform operation, most often a modulo 2 fast Fourier transform, or FFT, which transforms data series whose points number a power of two.

A significant limitation in determination of the spectra of signals is that data can only be collected, recorded, and processed for a finite length of time. The length of $T_0$ is limited by recording and processing capacity. If data is recorded for long intervals and processed in real time, processing capacity requirements are higher. If the data is processed later, storage requirements are higher. In some applications, $T_0$ is also limited by the fact that decisions must be made quickly based on processing results, limiting the time available to sample the data.

Discrete Fourier transforms are limited to determining component frequencies which are periodic within the time interval $T_0$. Since the limited length of $T_0$ often causes component frequencies to be non-periodic, the transform distorts the true nature of the signal's frequency spectrum. This is referred to as frequency leakage, being characterized by peaks in the spectral function moving or "leaking" to greater or lesser frequencies, creating sidelobes or other distortions.

Leakage can be viewed as caused by the truncation of non-zero portions of the signal by the finite-length $T_0$ window. The Fourier transform attempts to make up for the abrupt cutoffs at the ends of the window, creating frequencies in the spectral function which are not present in the original signal. In random signals, leakage is also caused by sampling the signal for a time $T_0$ which excludes dissimilar portions of the signal outside $T_0$.

The ideal window size exactly encompasses the beginning and ending of the signal. No leakage occurs in this case since the signal can be represented in the window by frequencies periodic in the window.

In the case of some transient signals, the ideal window is possible. A transient signal is one that begins at zero, remains non-zero for a finite length of time, then returns to zero and remains there. If a transient signal is short enough, the entire signal can be processed with no leakage. If available processing time and/or data memory are not capable of handling the entire non-zero signal, however, the window must be made shorter, thus truncating the non-zero portion of the signal and causing leakage in the spectral function.

Truncation and corresponding leakage is unavoidable in a random signal, since a random signal is one which has no beginning, no end, and does not repeat. In this case, leakage becomes less as $T_0$ increases. Even continuous signals that are sums of pure sinusoids often also experience problems of leakage from the inability of a window to make all component frequencies periodic.

Leakage has been controlled in the prior art by multiplying one of various available windowing functions of $T_0$ length to the series of sampled data points. In other words, each data point is weighted by the windowing function value at that point. Windowing functions control leakage in various ways depending on what is desired, one way being forcing the data point value toward zero at the end of the window to limit leakage of frequencies caused by truncation.

A simple boxcar windowing function (all data given equal weight) is applied to a transient signal which is untruncated within the time interval $T_0$. If the transient signal is too long for the entire signal to be included in the interval $T_0$, an exponential decay windowing function is often applied to artificially force the data points toward zero. The modified signal is Fourier transformed, and the spectral function of the original signal is projected based on the window function modifications.

The type of windowing function used with random signals is chosen according to the type of leakage control desired. Some spectral analysis programs automatically apply a certain type of windowing function to given types of signals, while others allow for some user selection.

Signals which are sums of pure sinusoids that are significantly seperated in frequency are often processed with a flat top windowing function to leak frequency components which are not periodic within the window to several adjacent spectral lines with the same amplitude. A flat top window function is one which ideally has a flat top shape in frequency space. The flat top windowing function in the prior art has been effective in reproducing the correct amplitude of a pure sinusoid, but has traditionally done so at the expense of severe leakage of frequency components to a band of frequencies, because of the limited window length in time space.

Once the linear frequency spectrum of the signal is determined from Fourier transform of the weighted data points, other spectra of interest such as energy spectra, power spectra, cross spectra, and combined spectra can be determined.

Each of the different windowing functions developed over the years control leakage to a certain extent and in certain ways, but no windowing function can eliminate leakage altogether for all signals. Leakage continues to be a problem in distorting the spectral function.

Resolution of the spectral function also depends on the length of the time window $T_0$. The first spectral line in the function, representing a component frequency of the signal, will be at 0 Hz, representing the DC component of the signal. The first non-zero spectral line will be at $f_0=1/T_0$, the second at $2f_0=2/T_0$, the third at $3f_0=3/T_0$, and so on to the Nyquist frequency, or one-half the sampling rate. The distance between spectral lines diminishes and resolution of the spectral function improves as $T_0$ increases.

OBJECTS AND SUMMARY OF THE INVENTION

It is therefore an object of the present invention to provide a method of reducing and containing frequency leakage of Fourier transformed signals which improves on the prior art.

It is a further object of the invention to provide a method to reduce frequency leakage of a Fourier transformed signal which is less sensitive to the shape of the windowing function chosen.

It is a further object of the invention to provide a method for increasing the number of transient signals able to be processed without leakage.

It is a further object of the invention to provide a method for increasing the efficacy of existing flat top windowing functions and to provide a new flat top windowing function.

In a first aspect of the invention, a method of processing a temporal signal comprises the steps of segmenting the signal into a plurality of segments, adding the segments together to form a shortened, summed signal, and transforming the summed signal to a spectral function. Specifically, and in a preferred embodiment, a windowing function is applied to the signal before segmentation, which windowing function may include, for example, a function approaching a flat top rectangular shape and width equaling the distance between two spectral lines in frequency space.

In a second aspect of the invention, a method of processing a signal comprises the steps of (1) sampling the signal at a predetermined sampling rate yielding a first series of data points, each data point having a value representative of the signal at a given time, (2) applying a windowing function to the first series of data points, (3) dividing the first series of data points into a plurality of segments, each segment comprising a plurality of data points, (4) adding together the values of a given data point in each segment, (5) repeating step (4) a predetermined number of times, each time for different data points in each segment, yielding a second series of summed data points, and (6) transforming the second series of data points.

In a third aspect of the invention, a variation on the method above comprises substituting steps 4 through 6 with the steps of (4) transforming each segment into a frequency domain signal having a plurality of frequency points, (5) adding together the values of a given frequency point in each segment, and (6) repeating step (5) a predetermined number of times, each time for each frequency point in each segment, yielding a series of summed frequency points.

Specifically, and in a preferred embodiment, a method of processing a first series of data points sampled from an analog signal comprises the steps of dividing the first series of data points into M blocks numbered from 0 to M−1, each block containing N data points numbered from 0 to N−1, adding each block into a memory having N registers numbered from 0 to N−1, the value of the data point in each block being added into the value in the correspondingly numbered register such that each numbered register contains the sum of correspondingly numbered data points in the blocks, and such that the memory comprises a second series of N data points; and Fourier transforming the second series of data points. The resulting spectral function will have leakage consistent with the first, longer series of data points at the frequencies of the second, shorter series.

A smoothed sinc windowing function can be applied to the signal for leakage to adjacent spectral lines, if desired, to avoid losing narrow-band components.

BRIEF DESCRIPTION OF THE DRAWINGS

The above objects, aspects, and embodiments of the present invention will be described with reference to the attached drag figures, of which.

DETAILED DESCRIPTION OF THE INVENTION

Figure 1:
FIG. 1 is a schematic view of an example of a signal processing system according to the invention.

FIG. 1 is a schematic view of an example of a signal processing system according to the invention. An analog signal is converted to digital by a sampler, which samples the signal at a rate dictated by storage and processing capacities and the reduction of frequency aliasing to an acceptable level. The sampling yields a set of data points collectively making up a data series.

A window processor windows a certain number of data points MN (M multiplied by N) of the series. We will label the time length of this windowed data set $T_W$. The data points are sequential in time from the first data point $x_0$ to the second data point $x_1$, the third $x_2$, and so on to the MNth data point, $x_{MN-1}$.

The window processor then applies a windowing function which weights the data points for leakage control. Depending on the type of signal processed and the leakage control desired, the windowing function may be a simple boxcar or one of any number of other available windowing functions known to those skilled in the art, including Parzen, Bartlett, Hanning, Hamming, and Welch windowing functions. A time-alias processor then time-aliases the weighted data series.

Figure 2:
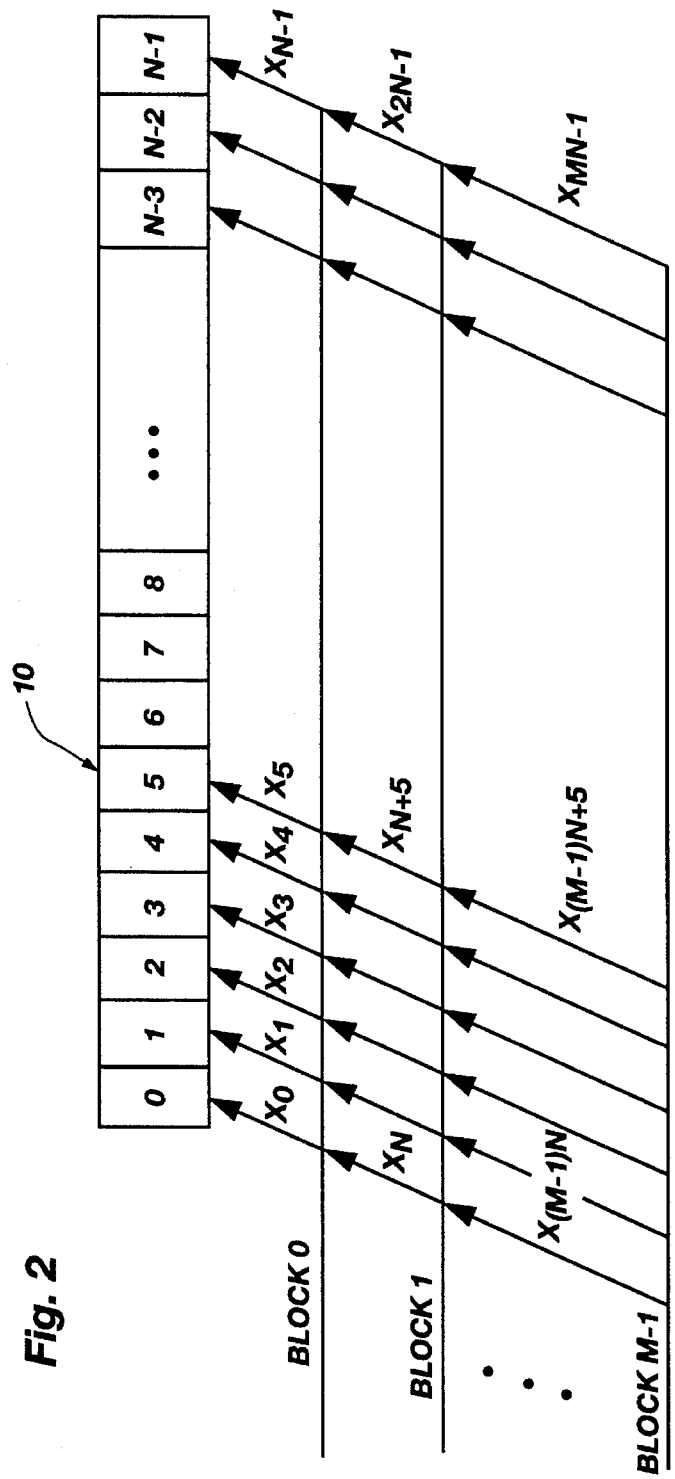
FIG. 2 is a schematic view of an example of a time-aliasing system according to the invention.

FIG. 2 schematically illustrates an example of time-aliasing according to the invention, in which the MN data points in the data series are divided into M blocks of N data points each. The blocks are added together and preferably normalized, resulting in a single time-aliased data series of data point length N and time length $T_0$ which is Fourier transformed.

As shown in FIG. 2, the data series MN is divided into blocks, the first block 0 comprising the first segment of N data points $x_0$ to $x_{N-1}$, the second block 1 comprising the second segment of N data points $x_N$ to $x_{2N-1}$, and so on to the Mth block M−1 which contains the Mth segment of data points $x_{(M-1)N}$ to $x_{MN-1}$.

To create a time-aliased N data point series, the data points in the original MN series are successively added into a memory 10 comprising N registers numbered from 0 to N−1, the registers preferably being zeroed before receiving the data. Data point $x_0$ is added to register 0, data point $x_1$ to register 1, data point $x_2$ to register 2, and so on until data point $x_{N-1}$ is added to register N−1. The next data point, $x_N$, Which is the first data point of the second block 1, is added to register 0, changing the value therein from $x_0$ to $x_0+x_N$. The next data point $x_{N+1}$ is added to register 1, the next data point $x_{N+2}$ to register 2, and so on until data point $x_{2N-1}$ is added to the last register N−1, after which the next data point, the first in the third block, is added to the first register 0. The process continues until the last data point $x_{MN-1}$ is added to register N−1.

When M successive blocks of N data points have been summed in this manner, a given register i in the memory 10 will contain the sum of M data points according to the equation $$S_i = \sum_{m=0}^{M-1} X_{i+mN}$$

In a preferred embodiment, the summed value of each register is then divided by the constant M to yield the average of the data points added therein, in order to normalize the data for consistency with a conventional N-point data series transform. This normalization may alternatively be done during later processing stages, or not at all, though in the latter case the larger values will need to be accounted for in analyzing the spectral function.

Referring again to FIG. 1, the time-aliased N data point series of time length $T_0$ is then operated on by an FFT processor, or similar operator such as a discrete Fourier transform (DFT) processor, to determine the component frequencies of the signal and yield a linear frequency spectrum. Other spectra can be determined from the linear spectrum, if desired. The spectral function is then displayed or otherwise output.

The spectrum of the $T_0$-length time-aliased N point data series will have leakage equivalent to that in a spectrum of the original $T_W$-length MN-point data series, at the harmonic frequencies or spectral lines of the N-point transform.

Unlike the prior art, where $T_W = T_0$, time aliasing allows $T_W$ to be increased to reduce leakage while the length of data actually processed by the Fourier transform processor, $T_0$, remains the same, i.e., $T_W = MT_0$. With the effectively increased window length, the width of the frequency characteristic and hence leakage is reduced by a factor of 1/M, making the selection of the particular windowing function less critical since the latter has less effect on the spectral shape and nature of the leakage. In general, any window that satisfactorily reduces the sidelobes of the spectral function is adequate. The operator can increase M in place of using a windowing function that further suppresses the sidelobes.

One application of time aliasing is to allow expansion of the original $T_W$-length window to encompass the entire length of transient signals which are too long to be directly contained in a $T_0$-length window. This action effectively reduces frequency leakage to zero at the spectral lines of the $T_0$ transform, allowing the use of a boxcar window since all component frequencies are contained within the $T_W$ window.

Time aliasing also reduces leakage in transforms of random signals because it allows for greater sampling and thus better inclusion of component frequencies.

The segments of the MN data series need not be summed in the exact way shown in FIG. 2. Other methods of adding the different time components of the signal will be apparent to those skilled in the art in light of this disclosure. For example, the signal may be windowed, segmented, and summed analytically in analog form each segment may be transformed and summed after transformation rather than before. The blocks of data are equal in length in the preferred embodiment.

The invention is also useful for reducing leakage in time space if a spectral function is inverse transformed. In this case, the blocking and summing operation shown in FIG. 2 is simply done with a sampled data set representing the frequency function, with the addition of a folding process consistent with frequency aliasing.

The above embodiment of the invention is useful for processing long transient signals and random or sinusoidal sum signals that are relatively broad band. If the signal, however, contains narrow band spectral components, i.e., frequencies which fall between the spectral lines of the N-point transform, it may not be desirable to reduce leakage according to the above embodiment since important frequency components may be missed. Though time aliasing reduces leakage to the extent of the $T_W$ window, it retains the resolution of the $T_0$ interval.

In the case of narrow band frequency components, it is often desirable to contain the leakage such that the frequency components can been, though slightly away from their correct spectral location.

Figure 3:
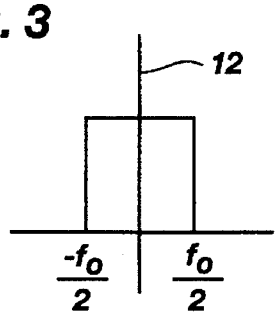
FIG. 3 is a view of an ideal flat top windowing function for leakage of frequency components to adjacent spectral lines.

In general, the most effective containment of leakage contains it within the smallest distance possible in frequency space, which means leaking it to the nearest spectral line. The ideal windowing function for this purpose is one which has, in frequency space, a flat top rectangular shape and a unit width of $f_0$, where $f_0$ is the width between the spectral lines. An example of this function is shown in FIG. 3, in which all frequencies within $f_0/2$ on either side of a given spectral line 12 are leaked to the spectral line. The function will cause frequency components exactly between two adjacent spectral lines to leak half to one and half to the other.

Figure 4:
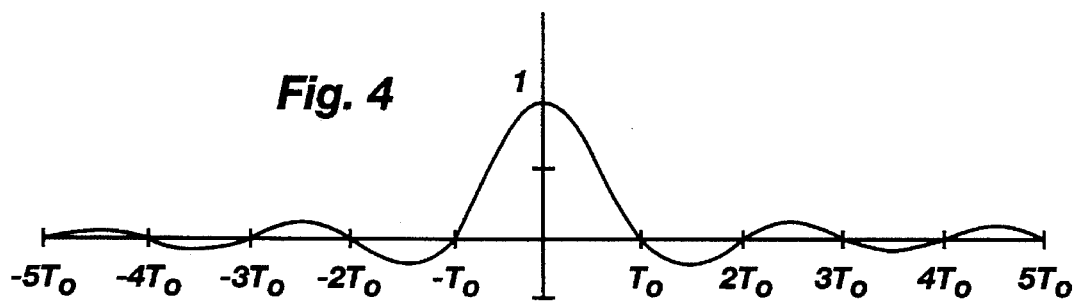
FIG. 4 is a view of a sinc function showing the $T_0$ necessary to make its spectral transform function the correct width.

One function which approaches rectangular spectral shape as it approaches infinity in temporal space is the sinc function (sin(x)/x) shown in FIG. 4. The longer the sinc function in time, the better it will approximate a spectral rectangle. In order to reduce the width of the rectangle to $f_0$ in frequency space, however, given the relation between $f_0$ and $T_0$, $T_0=1/f_0$, the sinc function in FIG. 4 must intersect the x-axis at intervals of $T_0$, the length of the processed data series, as the sinc function leaves the origin. This constraint drastically reduces the effectiveness of the sinc function for leakage containment to adjacent spectral lines in prior art systems because the original windowed time interval is the length that is ultimately tranformed, or $T_W=T_0$, and the sinc function approximates the unit rectangular shape very poorly.

When time aliasing is used, $T_W$ can be made larger than $T_0$, $T_W=MT_0$, so the sinc function's length as a windowing function can be increased even while obeying its fixed relation with $T_0$. As M increases the sinc function window lengthens and more closely approximates the ideal rectangular shape in frequency space.

One example of the equations for the windowing weights when the sinc function is used in conjunction with time aliasing are $$W_k \begin{bmatrix} = \dfrac{\sin\left(\dfrac{k}{N} - \dfrac{M}{2}\right)\pi}{\left(\dfrac{k}{N} - \dfrac{M}{2}\right)\pi} & 0 \leq k < \dfrac{MN}{2} \\ = 1 & k = \dfrac{MN}{2} \\ = W_{MN-k} & \dfrac{MN}{2} < k \leq MN-1 \end{bmatrix}$$

where $W_{k=0}$ is the weight given to the first data point in the MN-point data series, $W_{k=1}$ is the weight given to the second, and so on to the last data point $W_{k=MN-1}$. For the above equations to be valid, MN must be even since k is always an integer, though similar equations could be written for MN odd. In modulo 2 FFT algorithms N will be a power of two so M should be even in these cases. It may be preferable that M also be a power of two, but this is not critical.

To use the sinc windowing function with the embodiment of the invention illustrated in FIGS. 1 and 2, the window processor selects an MN-point data series of time length $T_W$ from the sampled data, and the MN data series is multiplied with the sinc windowing function of time length $T_W$ according to the above equations. The time-alias processor then time aliases the weighted MN-point data series to a time-aliased N-point data series as described above with reference to FIG. 2, and the time-aliased data series is Fourier transformed for determination of spectra. Since multiplying the sinc windowing function with the MN-point data series is equivalent to convolution in frequency space, the sinc function contains leakage to the nearest spectral line at every line in the resulting spectrum to the extent that the sinc function approximates the ideal unit rectangular shape.

Figure 5:
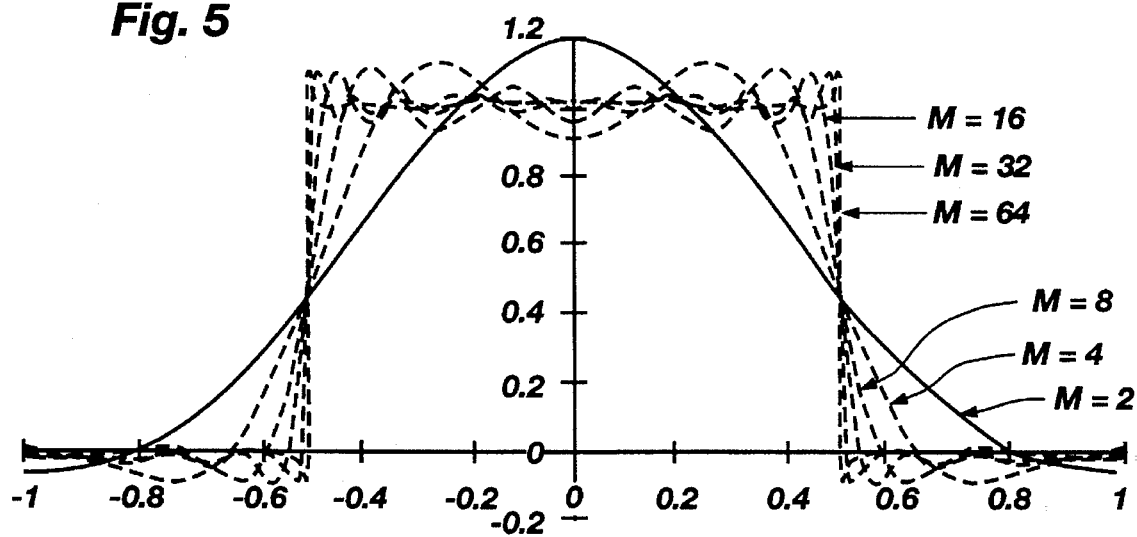
FIG. 5 is a view of the sinc function of FIG. 4 in frequency space as it approaches the ideal shape of FIG. 3.

FIG. 5 illustrates how the Fourier transformed sinc function approaches the unit rectangular shape as M increases from 2 to 64, i.e., as the sinc function's length increases in time.

Notwithstanding the usefulness of the sinc windowing function in conjunction with time aliasing, it can be seen in FIG. 5 that the top of the spectral rectangle contains undesirable ripple with M finite, which M of course must always be. A better approximation of the unit rectangular shape can be made if the ripple is smoothed by appropriate smoothing weights. Examples of appropriate smoothing weights for use with time aliasing are $$S_k \begin{bmatrix} = \dfrac{\sin\left(\dfrac{2k}{MN} - 1\right)\pi}{\left(\dfrac{2k}{MN} - 1\right)\pi} & 0 \leq k < \dfrac{MN}{2} \\ = 1 & k = \dfrac{MN}{2} \\ = S_{MN-k} & \dfrac{MN}{2} < k \leq MN-1 \end{bmatrix}$$

where $s_k$ is the smoothing weight for the kth data point.

We shall label the smoothed sinc windowing function an ssinc function, whose weights to be applied to the MN data point series are the product of the sinc weights and the smoothing weights:

$$ws_k = w_k s_k \quad 0 \leq k \leq MN-1$$

Figure 6:
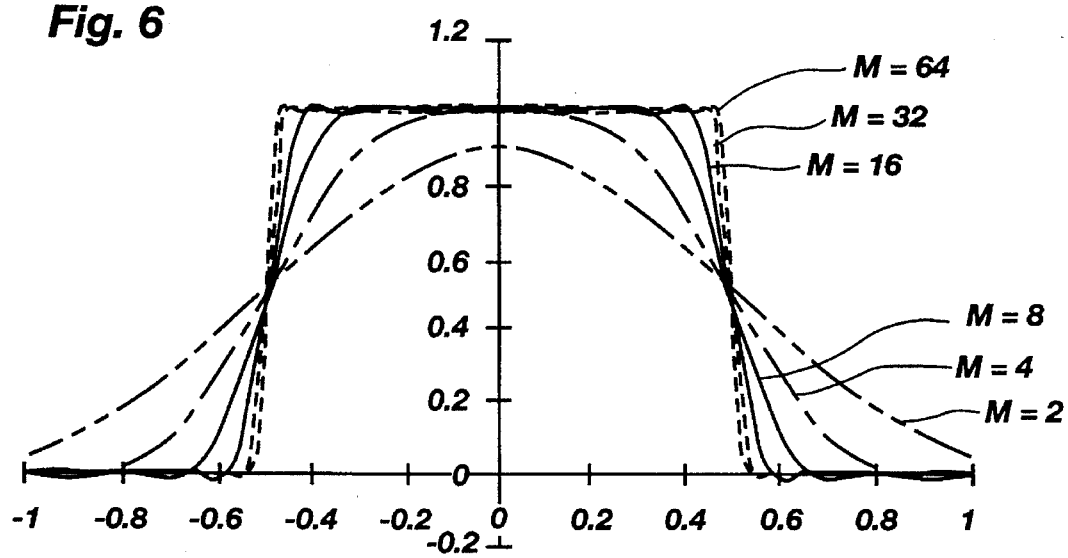
FIG. 6 is a view of a smoothed sinc, or ssinc, function in frequency space as it approaches the ideal shape of FIG. 3.

FIG. 6 illustrates how the spectral shape of the ssinc function approaches the unit rectangular shape, with minimal or no ripple, as M increases from 2 to 64. It can be seen from a comparison of FIG. 6 with FIG. 5 that the ssinc function more closely approximates the ideal shape than the sinc function at a given value of M. The invention makes the ssinc window significantly more useful than it otherwise would have been because of the longer period $T_W$ made possible by time aliasing.

Example 1

Figure 7:
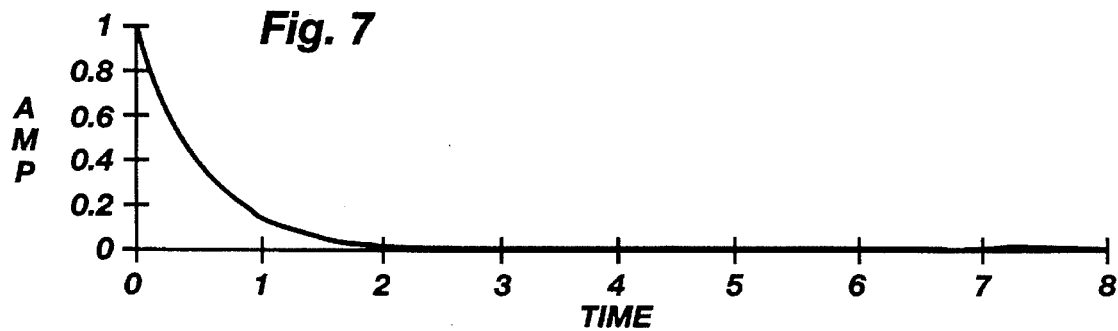
FIG. 7 is a view of an exponential decay signal over eight seconds.
Figure 8:
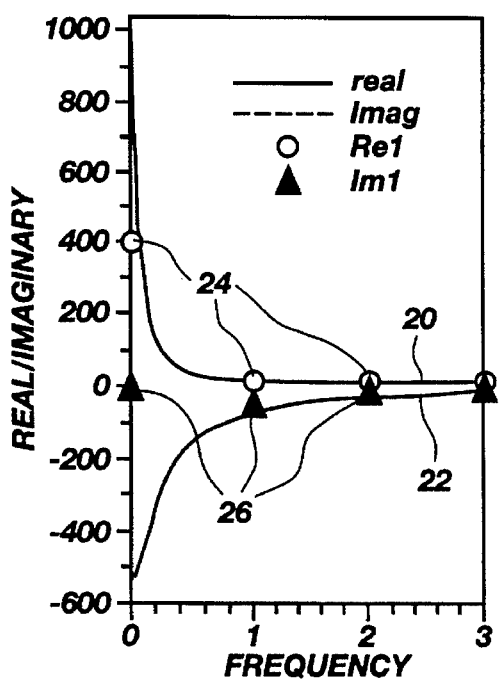
FIG. 8 is a view of the signal of FIG. 7 in frequency space, and showing frequency leakage caused by truncation.
Figure 9:
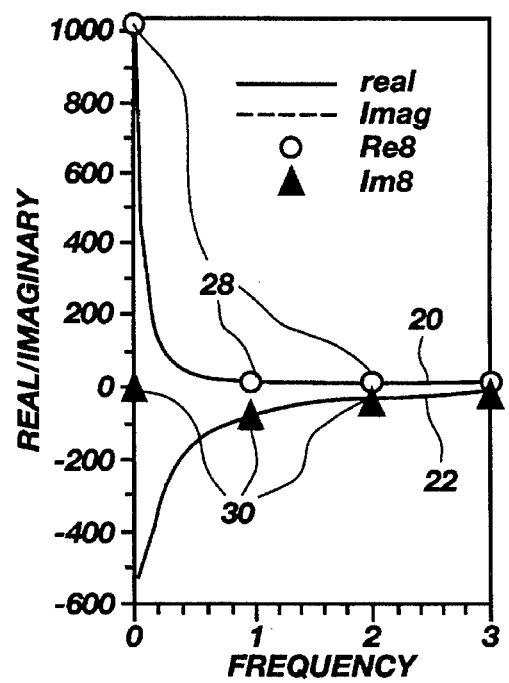
FIG. 9 is a view of the signal of FIG. 7 in frequency space, and showing reduced leakage through time-aliasing.
Figure 10:
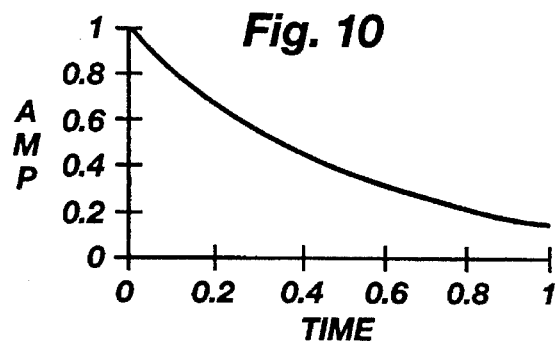
FIG. 10 is a view of the signal of FIG. 7 at 0–1 seconds.

FIG. 7 shows a temporal exponential decay signal having a two-second time constant from zero to eight seconds. The function was fast Fourier transformed in a boxcar window of 0–8 seconds, i.e., $T_W=T_0=8s$, resulting in the complex frequency spectral functions shown in FIGS. 8 and 9, the line 20 showing the real portion of the spectral function and the line 22 showing the corresponding imaginary portion. The signal was then windowed at an interval from 0–1 seconds, $T_W=T_0=1s$, as shown in FIG. 10, and given a boxcar windowing function. The non-zero portion of the temporal decay function was therefore truncated. FIG. 8 shows the spectral values resulting from Fourier transform of the 0–1s window, the points 24 representing the amplitude of the real spectral lines and the points 26 representing the amplitude of the imaginary spectral lines. It can be seen from FIG. 8 that substantial leakage occurred with the transform of the truncated signal.

Figure 11:
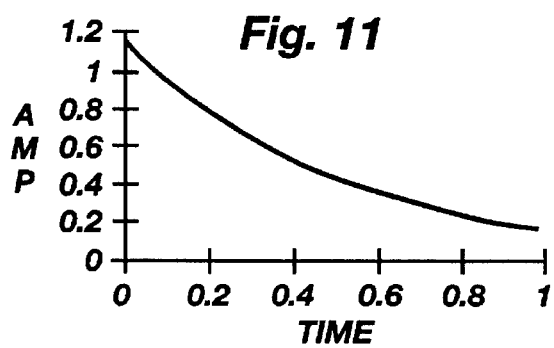
FIG. 11 is a view of the signal of FIG. 7 time-aliased from eight seconds to one second.

The signal of FIG. 7 was then time-aliased from eight seconds to one second, $T_W=8T_0$, creating the one-second time-aliased signal shown in FIG. 11. The time-aliased signal was Fourier transformed, resulting in the points 28 and 30 shown in FIG. 9 which represent the amplitude of the real and imaginary spectral lines, respectively. It can be seen from FIG. 9 that the transform of the one-second time-aliased signal had the same leakage characteristics as the transform of the eight-second original signal, $T_W=8s$, at the resolution of $T_0=1s$.

Example 2

Figure 12:
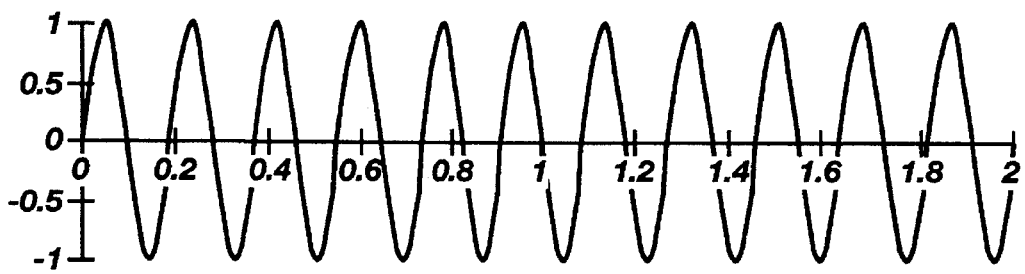
FIG. 12 is a view of a 5.5 Hz sinusoidal signal over two seconds.
Figure 13:
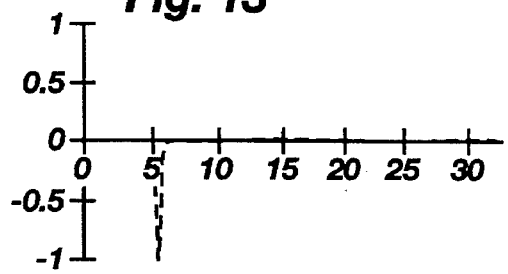
FIG. 13 is a view of the signal of FIG. 12 in frequency space after Fourier transform.

FIG. 12 shows a 5.5 Hz sinusoid signal, periodic in a two-second interval, which was sampled, windowed in a two-second window, $T_W=T_0=2$, with a boxcar windowing function, and transformed to the frequency domain by a DFT. The transform yielded the spectral function shown in FIG. 13 which approximates a single spectral line at 5.5 Hz.

Negligible or no leakage occurred due to the periodicity of the signal within the two-second window.

Figure 15:
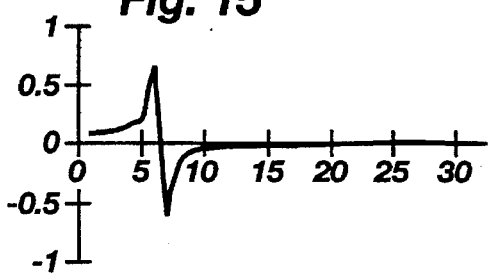
FIG. 15 is a view of the signal of FIG. 14 in frequency space after Fourier transform.
Figure 14:
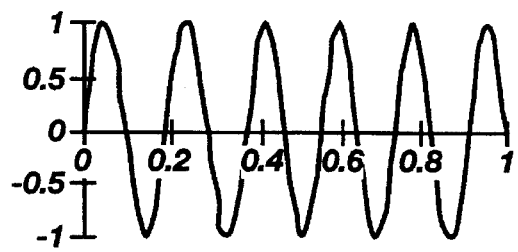
FIG. 14 is a view of the signal of FIG. 12 from 0–1 seconds.

The 5.5 Hz signal was then sampled and boxcar windowed for 0–1 seconds as shown in FIG. 14, $T_W=T_0=1$, and transformed by a DFT, resulting in the spectral function shown in FIG. 15 where the 5.5 Hz signal is leaked to various frequency lines about 5.5 Hz. The leakage occurred because the 5.5 Hz signal was not periodic in the one-second window of FIG. 14.

Figure 16:
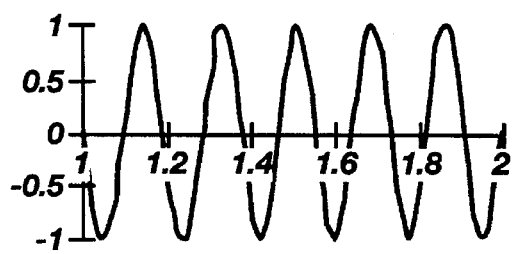
FIG. 16 a view of the signal of FIG. 12 from 1–2 seconds.

The two-second interval of the signal shown in FIG. 12 was then divided into two segments of one second each, a 0–1 second interval shown in FIG. 14 and a 1–2 second interval shown in FIG. 16. The signal was then time aliased from two to one seconds, $T_W=2T_0=2s$, creating a one-second time-aliased signal which was zero at all points since the 1–2s segment, FIG. 16, is the negative of the 0–1s segment, FIG. 14, over the entire one-second time-aliasing interval. A DFT of the time-aliased signal resulted in a spectral function which was also at all spectral lines of $T_0=1s$.

This example illustrates how in certain applications some contained leakage of frequency components between spectral lines is desirable in order to avoid losing important frequency components. As was predicted, the Fourier transform of the time-aliased signal was accurate, i.e., it reduced the leakage to that in two-second period $T_W$, at all spectral lines for $T_0=1s$. Spectral lines for $T_0=1s$ are separated by 1 Hz intervals. Since the original 5.5 Hz signal fell between the spectral lines of the time-aliased transform, and since the time-aliased transform function had the same leakage as the original 8-second window, the signal did not appear in the spectral function.

Example 3

The following function was sampled for an interval of $T_W=T_0=1s$, the function comprising a 10.2 Hz component of magnitude 5, a 20.5 Hz component with magnitude 8, and a 30.8 Hz component with magnitude 3:

$$x(t)=5\cos[2\pi(10.2)t]+8\cos[2\pi(20.5)t]+3\cos[2(30.8)t].$$

Figure 17:
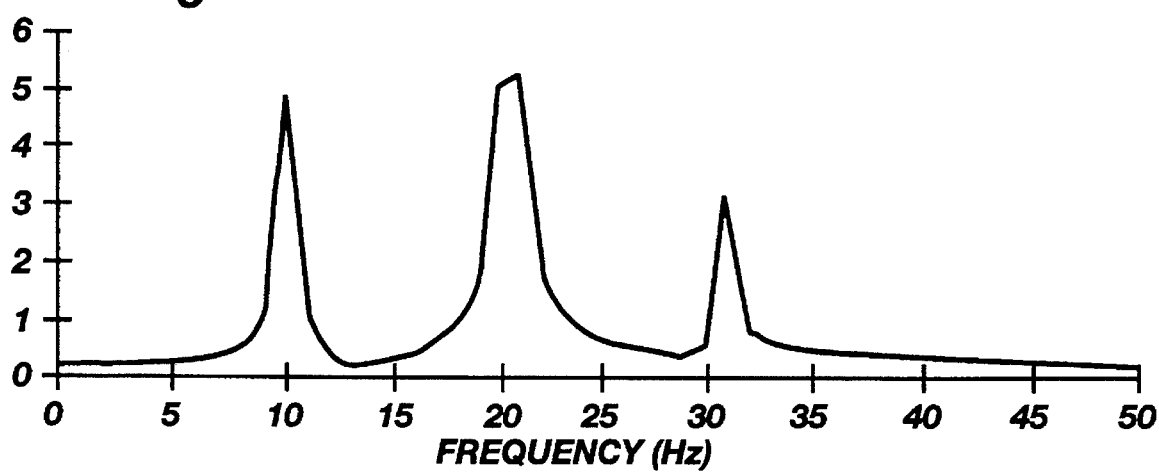
FIG. 17 is a view of a Fourier transformed function with leakage over several spectral lines.

The sampled function was Fourier transformed, yielding the spectral function shown in FIG. 17 in which all three frequency components were leaked to many spectral lines (of 1 Hz intervals) on both sides of the actual component frequencies.

Figure 18:
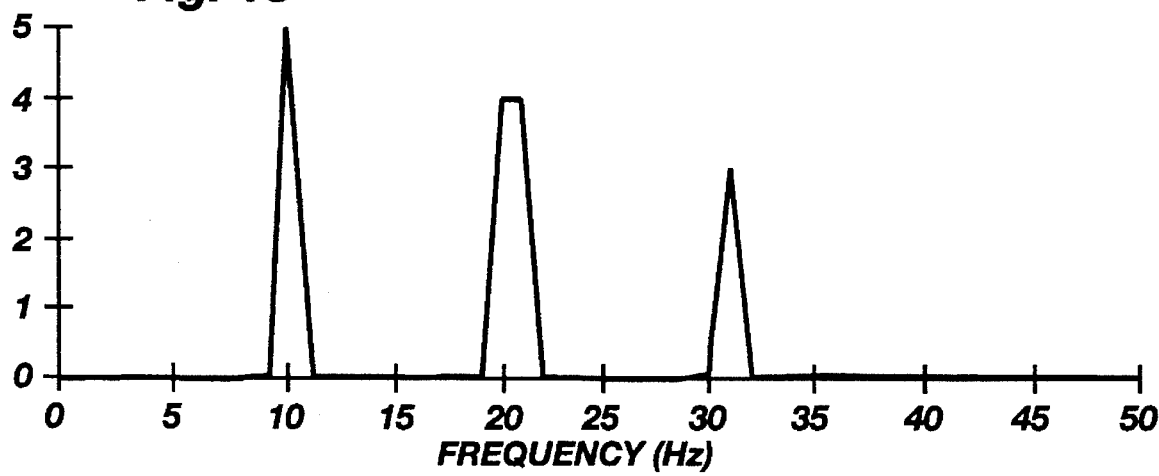
FIG. 18 is a view of a ssinc-windowed, time-aliased Fourier transformed function with leakage to adjacent spectral lines.

The function was then sampled for an interval of $T_W=8s$. A ssinc window was applied to the 8-second interval and the weighted signal was time aliased with M=8 to a 1-second interval, $T_0=1=T_W/8$. The weighted, time-aliased signal was Fourier transformed., yielding the spectral function shown in FIG. 18. As can be seen in FIG. 18, the ssinc window in conjunction with time-aliasing caused the 10.2 Hz component with magnitude 5 to leak to the nearest spectral line, 10 Hz. The 20.5 Hz component with magnitude 8, being exactly between the 20 Hz and 21 Hz spectral lines, leaked half to both, giving each a magnitude of 4. The 30.8 Hz component with 3 magnitude leaked to the 31 Hz spectral line.

Figure 19:
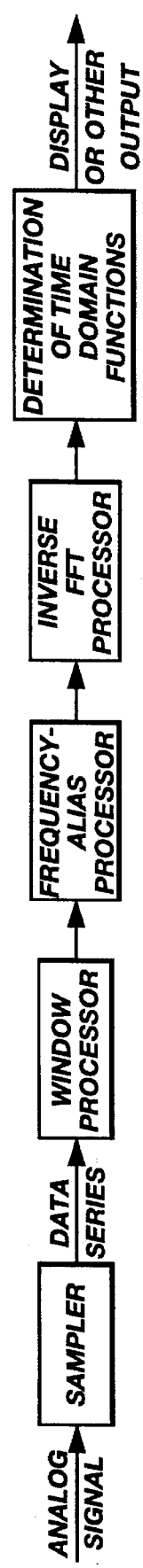
FIG. 19 is a flowchart of an example of a signal processing system according to an alternate embodiment of the present invention.

FIG. 19 illustrates an alternate embodiment of the present invention. Instead of time-alias processing, the data points are frequency-alias processed, producing frequency points that are then inverse transformed to time space.

Figure 20:
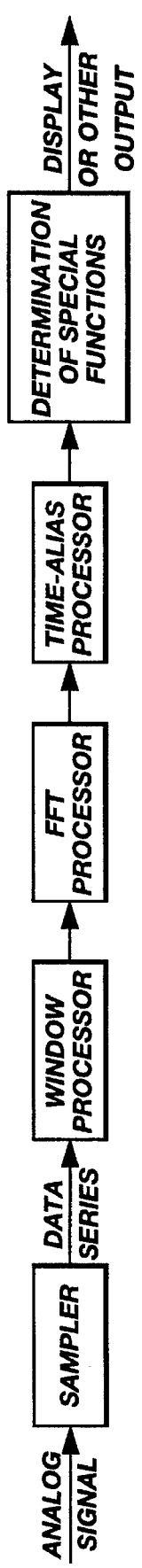
FIG. 20 is a flowchart of an example of a signal processing system according to an alternate embodiment of the present invention.

FIG. 20 illustrates another alternate embodiment of the present invention. The data points are Fourier transformed before undergoing the time-alias processing. This process is less efficient, but will yield the same results because of the linearity of the processing.

Figure 21:
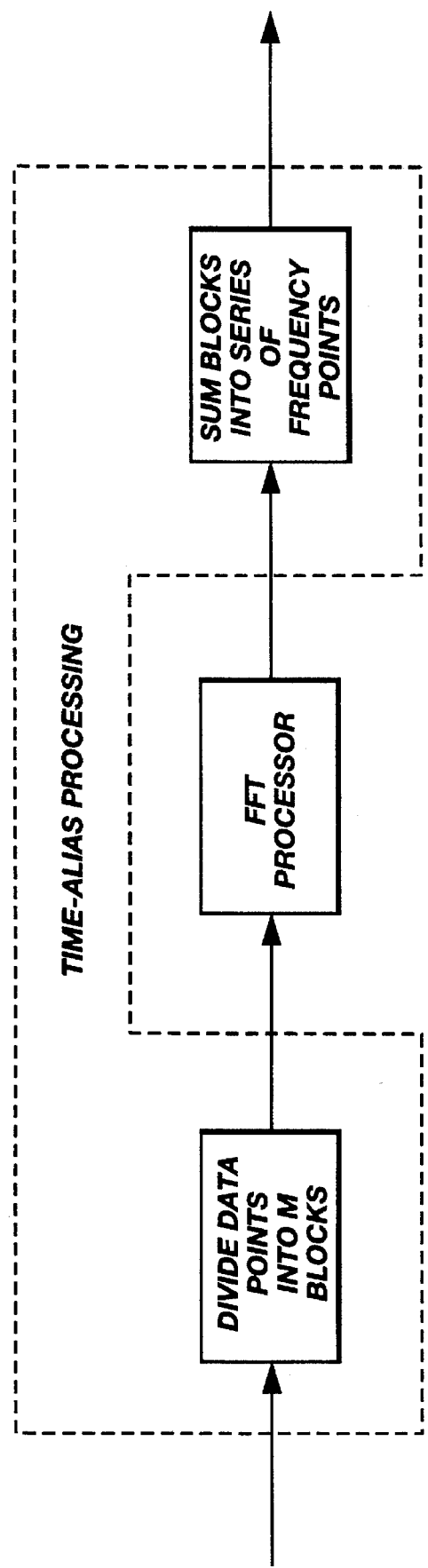
FIG. 21 is a flowchart of an example of a signal processing system according to an alternate embodiment of the present invention.

FIG. 21 illustrates another alternate embodiment of the present invention. The time-aliasing process is now split into two processes, one occurring before being Fourier transformed, and the other process after the transformation.

A few preferred embodiments of the invention have been disclosed herein. The embodiments can be modified or enhanced by those skilled in the art while remaining within the scope of the invention as set forth in the appended claims.

I claim:

1. A signal processing method in a spectral analyzer comprising the steps of:

sampling a signal waveform by the spectral analyzer for a length of time $T_W$, yielding a first series of MN data points numbered from $x_0$ to $x_{NM-1}$;

storing said data points in memory registers of the spectral analyzer;

weighting by a windowing function the first series of data points stored in said memory registers;

forming a time-aliased series of N data points numbered from 0 to N–1 and of time length $T_0$ by giving each data point i in the time-aliased series a value $S_i$ according to the equation $$S_i = \sum_{m=0}^{M-1} X_{i+mN}$$

transforming the time-aliased series of N data points to frequency space; and displaying the frequency spectra of the sampled waveform on a display of said spectral analyzer.

2. The method of claim 1 wherein the step of forming a time-aliased series of N data points includes dividing the value of each data point i by M.

3. The method of claim 1 wherein the step of weighting the first series of data points includes weighting each data point k according to the equation $$ws_k = w_k s_k \quad 0 \leq k \leq MN-1$$

where $$w_k \begin{cases} = \dfrac{\sin\left(\dfrac{k}{N} - \dfrac{M}{2}\right)\pi}{\left(\dfrac{k}{N} - \dfrac{M}{2}\right)\pi} & 0 \leq k < \dfrac{MN}{2} \\ = 1 & k = \dfrac{MN}{2} \\ = w_{MN-k} & \dfrac{MN}{2} < k \leq MN-1 \end{cases}$$

and $$s_k \begin{cases} = \dfrac{\sin\left(\dfrac{2k}{MN} - 1\right)\pi}{\left(\dfrac{2k}{MN} - 1\right)\pi} & 0 \leq k < \dfrac{MN}{2} \\ = 1 & k = \dfrac{MN}{2} \\ = s_{MN-k} & \dfrac{MN}{2} < k \leq MN-1 \end{cases}$$

4. A method of processing a temporal signal stored in memory registers of a spectral analyzer and comprising the steps of:

segmenting the signal stored in the spectral analyzer memory registers into a plurality of segments;

adding the segments together to form a shortened, summed signal; and transforming the summed signal to a spectral function and storing the transformed summed signal in the spectral analyzer memory registers.

5. The method of claim 4 further comprising the step of normalizing the summed signal before the step of transforming.

6. The method of claim 4 wherein the signal is represented digitally.

7. The method of claim 4 further comprising the step of applying a windowing function to the signal before segmenting the signal.

8. The method of claim 7 wherein the step of applying a windowing function includes applying a sinc function having a width of $f_0$ in the spectral function of the summed signal, where $f_0$ is the distance between two spectral lines.

9. The method of claim 8 wherein the step of applying a sinc function includes applying weights to the sinc function for smoothing of the spectral shape of the sinc function.

10. A method of processing a signal in a spectral analyzer and comprising the steps of:

(1) sampling the signal waveform by a spectral analyzer at a predetermined sampling rate yielding a first series of data points, each data point having a value representative of the signal at a given time, and storing said data points in memory registers of the spectral analyzer;

(2) applying a windowing function to the first series of data points stored in the spectral analyzer memory registers to weight said data points;

(3) dividing the first series of data points into a plurality of segments, each segment comprising a plurality of data points;

(4) adding together the values of a given data point in each segment;

(5) repeating step (4) a predetermined number of times, each time for different data points in each segment, yielding a second series of summed data points;

(6) Fourier transforming the second series of data points; and (7) Displaying the resulting frequency spectra on a display of the spectral analyzer.

11. The method of claim 10 wherein the step of transforming the second series of data points includes transforming the second series of data points to frequency space.

12. The method of claim 10 wherein the step of transforming the second series of data points includes transforming the second series of data points to time space.

13. The method of claim 10 further comprising the step of normalizing the second series of data points before transforming the second series of data points.

14. A method of processing a first series of data points obtained by a spectral analyzer, said data points sampled from an analog signal, and comprising the steps of:

dividing the first series of data points stored in memory registers of the spectral analyzer into M blocks numbered from 0 to M−1, each block containing N data points numbered from 0 to N−1;

adding each block into a memory of the spectral analyzer having N registers numbered from 0 to N−1, the value of the data point in each block being added into the value in the correspondingly numbered register such that each numbered register contains the sum of correspondingly numbered data points in the blocks, and such that the memory registers comprise a second series of N data points; and Fourier transforming the second series of data points in the spectral analyzer memory registers.

15. The method of claim 14 further comprising the step of normalizing the second series of data points before Fourier transforming the data points.

16. The method of claim 15 wherein the step of normalizing the values of the second series of data points includes dividing the value of each data point by M.

17. The method of claim 14 further comprising the step of applying a windowing function to the first series of data points.

18. The method of claim 17 wherein the step of applying a windowing function to the first series of data points includes applying a sinc function whose spectral width approximately equals the distance between two spectral lines of a spectral function resulting from the Fourier transform of the second series of data points.

19. The method of claim 18 wherein the step of applying a sinc function includes applying the following weights $W_k$ to each point k in the second series of data points:

$$W_k \begin{cases} = \dfrac{\sin\left(\dfrac{k}{N} - \dfrac{M}{2}\right)\pi}{\left(\dfrac{k}{N} - \dfrac{M}{2}\right)\pi} & 0 \leq k < \dfrac{MN}{2} \\ = 1 & k = \dfrac{MN}{2} \\ = W_{MN-k} & \dfrac{MN}{2} < k \leq MN - 1. \end{cases}$$

20. The method of claim 18 further comprising the step of applying smoothing weights to the sinc function.

21. The method of claim 20 wherein the step of applying smoothing weights includes applying the following smoothing weights $S_k$ to each point k in the second series of data points:

$$S_k \begin{cases} = \dfrac{\sin\left(\dfrac{2k}{MN} - 1\right)\pi}{\left(\dfrac{2k}{MN} - 1\right)\pi} & 0 \leq k < \dfrac{MN}{2} \\ = 1 & k = \dfrac{MN}{2} \\ = S_{MN-k} & \dfrac{MN}{2} < k \leq MN - 1 \end{cases}$$

22. A method of processing a temporal signal obtained by a spectrum analyzer and stored in said spectrum analyzer comprising the steps of:

segmenting the temporal signal stored in the spectrum analyzer into a plurality of segments;

transforming the segments of the temporal signal into the frequency domain; and adding the frequency domain segments to form an averaged spectral signal.

23. A method of processing a signal in a spectral analyzer and comprising the steps of:

(1) sampling the signal waveform by the spectral analyzer at a predetermined sampling rate yielding a first series of data points, each data point having a value representative of the signal at a given time, and storing said data points in memory registers of the spectral analyzer;

(2) applying a windowing function to the first series of data points to weight said data points in the spectral analyzer memory registers;

(3) dividing the first series of data points into a plurality of segments, each segment comprising a plurality of data points;

(4) Fourier transforming each segment into a frequency domain signal having a plurality of frequency points;

(5) adding together the values of a given frequency point in each segment;

(6) repeating step (5) a predetermined number of times, each time for each frequency point in each segment, yielding a series of summed frequency points; and (7) Displaying the resulting frequency spectra on a display of the spectral analyzer.

24. A method of processing a first series of data points sampled by a spectral analyzer from an analog signal, and comprising the steps of:

dividing the first series of data points stored in memory registers of the spectral analyzer into M blocks numbered from 0 to M−1, each block containing N data points numbered from 0 to N−1;

Fourier transforming the data points to form M blocks, each block containing N frequency points; and adding each block into a memory register of the spectral analyzer, the value of corresponding frequency points of the blocks being added together to obtain a series of summed frequency points.

* * * * *